(12) United States Patent
Ditizio et al.

(10) Patent No.: US 9,708,707 B2
(45) Date of Patent: Jul. 18, 2017

(54) NANOLAYER DEPOSITION USING BIAS POWER TREATMENT

(75) Inventors: Robert Anthony Ditizio, Petaluma, CA (US); Tue Nguyen, Fremont, CA (US); Tai Dung Nguyen, Fremont, CA (US)

(73) Assignee: ASM INTERNATIONAL N.V. (NL)

( * ) Notice: Subject to any disclaimer, the term of this patent is extended or adjusted under 35 U.S.C. 154(b) by 818 days.

(21) Appl. No.: 12/783,431

(22) Filed: May 19, 2010

(65) Prior Publication Data

US 2010/0285237 A1    Nov. 11, 2010

(51) Int. Cl.
  *C23C 16/34* (2006.01)
  *C23C 16/455* (2006.01)
  *C23C 16/507* (2006.01)

(52) U.S. Cl.
  CPC ........ *C23C 16/34* (2013.01); *C23C 16/45523* (2013.01); *C23C 16/507* (2013.01)

(58) Field of Classification Search
  None
  See application file for complete search history.

(56) References Cited

U.S. PATENT DOCUMENTS

| 3,632,406 | A |   | 1/1972  | Clough et al.   |            |
|-----------|---|---|---------|-----------------|------------|
| 4,058,430 | A |   | 11/1977 | Suntola et al.  |            |
| 4,439,463 | A |   | 3/1984  | Miller          |            |
| 4,750,077 | A |   | 6/1988  | Amagasa         |            |
| 4,783,248 | A |   | 11/1988 | Kohlhase et al. |            |
| 4,900,716 | A |   | 2/1990  | Fujita et al.   |            |
| 4,918,031 | A |   | 4/1990  | Flamm et al.    |            |
| 4,935,661 | A | * | 6/1990  | Heinecke et al. | 313/231.31 |
| 5,102,694 | A |   | 4/1992  | Taylor et al.   |            |
| 5,242,530 | A |   | 9/1993  | Batey et al.    |            |
| 5,273,783 | A |   | 12/1993 | Wanner          |            |
| 5,306,666 | A |   | 4/1994  | Izumi et al.    |            |
| 5,314,603 | A | * | 5/1994  | Sugiyama et al. | 204/298.32 |
| 5,344,792 | A |   | 9/1994  | Sandhu et al.   |            |
| 5,460,689 | A |   | 10/1995 | Raaijmakers et al. |         |
| 5,468,341 | A |   | 11/1995 | Samukawa        |            |
| 5,529,657 | A |   | 6/1996  | Ishii           |            |

(Continued)

FOREIGN PATENT DOCUMENTS

| JP | H05-148654 | 6/1993 |
|----|------------|--------|
| JP | 10-064849  | 3/1998 |

(Continued)

OTHER PUBLICATIONS

Final Office Action dated Apr. 9, 2013 in U.S. Appl. No. 13/235,909, filed Sep. 19, 2011.

(Continued)

*Primary Examiner* — Joel Horning
(74) *Attorney, Agent, or Firm* — Knobbe, Martens, Olson & Bear LLP

(57) ABSTRACT

A hybrid deposition process of CVD and ALD, called NanoLayer Deposition (NLD) is provided. The NLD process is a cyclic sequential deposition process, comprising introducing a first plurality of precursors to deposit a thin layer with the deposition process not self limiting, followed by introducing a second plurality of precursors for plasma treating the thin deposited layer. The plasma can be isotropic, anisotropic, or a combination of isotropic and anisotropic to optimize the effectiveness of the treatment of the thin deposited layers.

35 Claims, 7 Drawing Sheets

(56) References Cited

U.S. PATENT DOCUMENTS

| | | | |
|---|---|---|---|
| 5,556,501 A | 9/1996 | Collins et al. |
| 5,571,366 A | 11/1996 | Ishii et al. |
| 5,576,071 A | 11/1996 | Sandhu |
| 5,580,385 A | 12/1996 | Paranjpe et al. |
| 5,627,013 A | 5/1997 | Kamisawa |
| 5,654,679 A | 8/1997 | Mavretic et al. |
| 5,688,565 A | 11/1997 | McMillan et al. |
| 5,747,116 A | 5/1998 | Sharan et al. |
| 5,773,363 A | 6/1998 | Derderian et al. |
| 5,792,522 A | 8/1998 | Jin et al. |
| 5,851,293 A | 12/1998 | Lane et al. |
| 5,870,121 A | 2/1999 | Chan |
| 5,871,811 A | 2/1999 | Wang et al. |
| 5,902,563 A | 5/1999 | Pinneo |
| 5,916,365 A | 6/1999 | Sherman |
| 5,919,531 A | 7/1999 | Arkles et al. |
| 5,961,793 A | 10/1999 | Ngan |
| 5,968,610 A | 10/1999 | Liu et al. |
| 5,972,179 A | 10/1999 | Chittipeddi et al. |
| 5,972,430 A | 10/1999 | DiMeo et al. |
| 5,981,373 A | 11/1999 | Sunada |
| 5,985,375 A | 11/1999 | Donohoe et al. |
| 5,989,999 A * | 11/1999 | Levine et al. | 438/627 |
| 5,993,916 A * | 11/1999 | Zhao et al. | 427/535 |
| 6,015,590 A | 1/2000 | Suntola et al. |
| 6,024,826 A | 2/2000 | Collins et al. |
| 6,040,021 A | 3/2000 | Miyamoto |
| 6,054,191 A | 4/2000 | Sharan et al. |
| 6,066,609 A | 5/2000 | Martin et al. |
| 6,089,184 A | 7/2000 | Kaizuka et al. |
| 6,101,971 A | 8/2000 | Denholm et al. |
| 6,110,531 A | 8/2000 | Paz de Araujo et al. |
| 6,146,907 A | 11/2000 | Xiang et al. |
| 6,150,209 A | 11/2000 | Sun et al. |
| 6,158,384 A | 12/2000 | Ye et al. |
| 6,159,842 A | 12/2000 | Chang et al. |
| 6,200,651 B1 | 3/2001 | Roche et al. |
| 6,200,893 B1 | 3/2001 | Sneh |
| 6,221,792 B1 | 4/2001 | Yang et al. |
| 6,236,076 B1 | 5/2001 | Arita et al. |
| 6,268,288 B1 | 7/2001 | Hautala et al. |
| 6,306,211 B1 | 10/2001 | Takahashi et al. |
| 6,331,493 B1 | 12/2001 | Sharan |
| 6,333,202 B1 | 12/2001 | Adkisson et al. |
| 6,342,277 B1 | 1/2002 | Sherman |
| 6,406,991 B2 | 6/2002 | Sugihara |
| 6,436,819 B1 | 8/2002 | Zhang et al. |
| 6,451,161 B1 | 9/2002 | Jeng et al. |
| 6,451,390 B1 | 9/2002 | Goto et al. |
| 6,451,695 B2 | 9/2002 | Sneh |
| 6,475,910 B1 | 11/2002 | Sneh |
| 6,492,283 B2 | 12/2002 | Raaijmakers et al. |
| 6,521,529 B1 | 2/2003 | Ngo et al. |
| 6,521,544 B1 | 2/2003 | Agarwal et al. |
| 6,534,395 B2 | 3/2003 | Werkhoven et al. |
| 6,560,991 B1 | 5/2003 | Kotliar |
| 6,610,169 B2 | 8/2003 | Nguyen et al. |
| 6,613,656 B2 | 9/2003 | Li |
| 6,689,220 B1 | 2/2004 | Nguyen |
| 6,756,318 B2 | 6/2004 | Nguyen et al. |
| 6,800,173 B2 | 10/2004 | Chiang et al. |
| 6,833,161 B2 | 12/2004 | Wang et al. |
| 6,951,804 B2 | 10/2005 | Seutter et al. |
| 6,987,059 B1 | 1/2006 | Burke et al. |
| 7,148,155 B1 | 12/2006 | Tarafdar et al. |
| 7,235,484 B2 | 6/2007 | Nguyen et al. |
| 7,361,387 B2 | 4/2008 | Nguyen |
| 7,442,615 B2 | 10/2008 | Nguyen et al. |
| 7,713,592 B2 | 5/2010 | Nguyen et al. |
| 7,718,538 B2 | 5/2010 | Kim et al. |
| 7,867,905 B2 | 1/2011 | Nguyen et al. |
| 8,658,259 B2 | 2/2014 | Nguyen et al. |
| 8,940,374 B2 | 1/2015 | Nguyen et al. |
| 9,121,098 B2 | 9/2015 | Ditizio et al. |
| 9,447,496 B2 | 9/2016 | Nguyen et al. |
| 2002/0004293 A1 | 1/2002 | Soininen et al. |
| 2002/0106846 A1 | 8/2002 | Seutter et al. |
| 2002/0110991 A1 | 8/2002 | Li |
| 2002/0170677 A1 | 11/2002 | Tucker et al. |
| 2002/0192954 A1 | 12/2002 | Sneh |
| 2002/0197403 A1 | 12/2002 | Arkles et al. |
| 2002/0197864 A1 | 12/2002 | Sneh |
| 2003/0082296 A1 | 5/2003 | Elers et al. |
| 2003/0161952 A1 | 8/2003 | Wang et al. |
| 2006/0211223 A1 * | 9/2006 | Brcka | 438/493 |

FOREIGN PATENT DOCUMENTS

| | | |
|---|---|---|
| JP | 2002-541332 | 12/2002 |
| KR | 2001-0082706 | 8/2001 |
| WO | WO 00/61833 | 10/2000 |
| WO | WO 00/79019 A1 | 12/2000 |

OTHER PUBLICATIONS

Office Action dated Oct. 17, 2012 in Korean Patent Application No. 10-2012-7018629, filed Jul. 16, 2012

Office Action dated Jun. 11, 2013 in U.S. Appl. No. 12/732,825, filed Mar. 26, 2010.

Office Action dated Mar. 13, 2013 in U.S. Appl. No. 13/449,241, filed Apr. 17, 2012.

Final Office Action dated Oct. 28, 2013 in U.S. Appl. No. 13/449,241.

Final Office Action dated Aug. 22, 2013 in U.S. Appl. No. 13/449,175, filed Oct. 15, 2013.

Office Action dated Dec. 2, 2013 in U.S. Appl. No. 13/449,175.

Final Office Action dated Aug. 7, 2013 in U.S. Appl. No. 13/480,912, filed Oct. 4, 2013.

Office Action dated Nov. 8, 2013 in U.S. Appl. No. 13/480,912.

Rejection dated May 30, 2013 in Korean Patent Application No. 10-2012-7018629.

Office Action dated Dec. 24, 2013 in Korean Patent Application No. 10-2013-7023126.

Office Action dated Mar. 25, 2013 in U.S. Appl. No. 13/449,175, filed Apr. 17, 2012.

Office Action dated Apr. 12, 2013 in U.S. Appl. No. 13/480,912, filed May 25, 2012.

Office Action dated Dec. 10, 2012 in U.S. Appl. No. 13/235,909, filed Sep. 19, 2011.

Office Action dated May 22, 2014 in U.S. Appl. No. 13/449,241, filed Apr. 17, 2012.

Final Office Action dated May 7, 2014 in U.S. Appl. No. 13/449,175, filed Apr. 17, 2012.

Final Office Action dated Apr. 2, 2014 in U.S. Appl. No. 13/480,912, filed May 25, 2012.

Rejection dated May 27, 2014 in Korean Application No. 10-2012-7018629, filed Jul. 16, 2012.

Heckman et al., "The evolution of RF power delivery in plasma processing," World Wide Web Page advanced-energy.com/upload/File/White_Papers/SL-WHITE8-270-01.pdf.

Park et al., "Effect of ion bombardment during chemical vapor deposition of TiN films," J. Electrochem. Soc., 2000, pp. 2711-2717, vol. 147, No. 7, The Electromechanical Society, Inc.

Scholl, Richard A., "Forward and Reflected Powers. What Do They Mean?" Advanced Energy Industries, Inc., World Wide Web Page advanced-energy.com/upload/File/White_Papers/SL-WHITE7-270-01.pdf, 4 pages.

Data Sheet for Inductively-Coupled Plasma (ICP) Source, Advanced Energy, Industries, Inc., Copyright 2000, 2 pages.

Data sheet for AZX Series 13.56 MHz RF Impedance Matching Networks, Advanced Energy, Industries, Inc., Copyright 1994, 4 pages.

Data sheet for Impedance Matching Option for NOVA RF Plasma Generators, ENI, Copyright 2000, 2 pages.

Data sheet for HFV-L Variable-Frequency Generators, Advanced Energy, Industries, Inc., 1999, 4 pages.

(56) References Cited

OTHER PUBLICATIONS

Tech note 33: "Introducing Power Supplies and Plasma Systems," World Wide Web Page advanced-energy.com/upload/File/White_Papers/SL-WHITE17-270-01.pdf, 8 pages.

Tech note 34: "Impedance Matching," World Wide Web Page advanced-energy.com/upload/File/White_Papers/eng-white18-270-02.pdf, 12 pages.

International Search Report dated Sep. 2, 2004, PCT application No. PCT/US04/03349 filed Feb. 4, 2004, 10 pages.

Baumert et al., "Characterization of sputtered barium strontium titanate and strontium titanate-thin film", *J. Appl. Phys.* 82 (5), Sep. 1, 1997; pp. 2558-2566.

Goto, H. et al., "Atomic Layer Controlled Deposition of Silicon-Nitride with Self-Limiting Mechanism", *Appl. Phys. Lett.*, 68 (23), Jun. 1996, pp. 3257-3259.

Goto, H. et al., "Atomic Layer Controlled Deposition of Silicon-Nitride with Self-Limiting Mechanism", *Technical Report of IEICE*, vol. 95, No. 181, Dec. 1995, pp. 47-54.

Ozeki, M. et al., "Kinetic Processes in Atomic-Layer Epitaxy of GaAs and AIAs Using a Pulsed Vapor-Phase Method", *Journal of Vacuum Science and Technology B*, vol. 5, No. 4, Jul./Aug. 1987, pp. 1184-1186.

\* cited by examiner

NANOLAYER DEPOSITION USING BIAS POWER TREATMENT

BACKGROUND

The present invention relates to semiconductor thin film processing by nanolayer deposition (NLD). The fabrication of modern semiconductor device structures has traditionally relied on plasma processing in a variety of operations such as etching and deposition. In plasma etching, for example, chemically reactive gas molecules and energetic ions are used to remove material from a substrate. Plasmas are also used in a number of deposition techniques such as Physical Vapor Deposition (PVD) and Plasma Enhanced Chemical Vapor Deposition (PECVD).

In PVD processes, also known as sputter deposition processes, plasmas are necessary to ionize gas molecules that are driven into a sputter target to generate a vapor of atoms and clusters of atoms that are subsequently deposited onto a substrate. PVD processes are typically performed in a high vacuum apparatus.

PVD is a line-of-sight deposition process in which material sputtered from the source target tends to preferentially adhere to surfaces that are exposed directly to the target with little or no reflection from surfaces inside the vacuum chamber or on the surface of the substrate. In line-of-sight deposition systems, such as PVD systems, the formation of conformal layers over topographical features with aspect ratios of greater than 2-4 to 1 is, therefore, difficult or not possible to achieve.

In CVD, a gas or vapor mixture consisting of one or more precursors is flowed over the surface of a substrate that is heated to an elevated temperature. Reactions then occur at the hot surface resulting in a film of deposited material. The temperature of the wafer surface is an important parameter in CVD that affects the film properties and deposition rates. High temperatures of 350° C. and higher can be required for thermal CVD processes and these temperatures may not be compatible with other processes in an integrated semiconductor fabrication process flow. As a result of this temperature limitation, plasmas have been introduced into CVD processes to enhance the deposition rate, and provide for improved film quality at lower substrate temperatures. More details on PVD and CVD methods are discussed in International Publication Number WO 00/79019 A1 or PCT/US00/17202 to Gadgil, the content of which is incorporated by reference.

An alternative to PVD and CVD is atomic layer deposition (ALD). ALD is a cyclic deposition process in which a first reactive precursor gas is injected into a chamber, for durations as short as 100-500 milliseconds, to adsorb onto a substrate and in which a second reactive precursor gas is then injected to react with the first precursor gas on the substrate to form a thin layer of deposited film. The ALD process consists of alternating steps of evacuating a chamber, introducing a first precursor to form a monolayer or less on a substrate, again evacuating the chamber, and introducing a second precursor to react with the first precursor on the substrate to form a thin layer of deposited film. This alternating sequence is repeated until a desired film thickness is achieved. In ALD, the substrate is generally heated to drive the reaction between the second and the first precursors and can be as high as 400° C. for some processes, or higher.

U.S. Pat. No. 5,916,365 to Sherman, entitled "Sequential chemical vapor deposition" provides for sequential chemical vapor deposition by employing a reactor operated at low pressure, a pump to remove excess reactants, and a line to introduce gas into the reactor through a valve. Sherman teaches exposing the part to be coated to a gaseous first reactant, including a non-semiconductor element of the thin film to be formed, wherein the first reactant adsorbs on the part to be coated. The deposited film thickness in each cycle is a monolayer or less. The first reactant forms a monolayer on the part to be coated (after multiple cycles), while the second reactant passes through a radical generator which partially decomposes or activates the second reactant into a gaseous radical before it impinges on the monolayer. This second reactant does not necessarily form a monolayer, but is available to react with the monolayer. A pump removes the excess second reactant and reaction products completing the process cycle. The process cycle can be repeated to grow the desired thickness of film.

U.S. Pat. No. 6,200,893 to Sneh entitled "Radical-assisted sequential CVD" discusses a method for CVD on a substrate wherein radical species are used in alternate steps to deposit a film from a molecular precursor, to treat the material deposited from the molecular precursor, and to prepare the substrate surface with a reactive chemical in preparation for the subsequent molecular precursor step. By repetitive cycling, a composite integrated film is produced. In a preferred embodiment, the deposited layers from the molecular precursor are metals, and the radicals in the alternating treatment steps are used to remove ligands remaining from the metal precursor reactions, and to oxidize or form a nitride of the metal surface in subsequent layers.

In one embodiment taught by Sneh, a metal is deposited onto a substrate surface in a deposition chamber by: (a) depositing a monolayer of metal on the substrate surface by flowing a molecular precursor gas or vapor bearing the metal over a surface of the substrate, the surface saturated by a first reactive species with which the precursor will react by depositing the metal and forming reaction products, leaving a metal surface covered with ligands from the metal precursor and therefore not further reactive with the precursor; (b) terminating flow of the precursor gas or vapor; (c) purging the precursor with inert gas; (d) flowing at least one radical species into the chamber and over the surface, the radical species highly reactive with the surface ligands of the metal precursor layer and eliminating the ligands as reaction product, and also saturating the surface, providing the first reactive species; and (e) repeating the steps in order until a metallic film of desired thickness is achieved.

In another aspect of the Sneh disclosure, a metal nitride is deposited on a substrate surface in a deposition chamber by: (a) depositing a monolayer of metal on the substrate surface by flowing a metal precursor gas or vapor bearing the metal over a surface of the substrate, the surface saturated by a first reactive species with which the precursor reacts by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the atomic species highly reactive with the surface ligands of the metal precursor layer and eliminating the ligands as reaction product and also saturating the surface; (e) flowing radical nitrogen into the chamber to combine with the metal monolayer deposited in step (a), forming a nitride of the metal; (f) flowing a third radical species into the chamber terminating the surface with the first reactive species in preparation for a next metal deposition step; and (g) repeating the steps in order until a composite film of desired thickness is achieved.

In the Sneh embodiments, monolayers or fractions of monolayers are deposited in each cycle of a multi-cycle process and, as a result, the deposition of typical film thicknesses on the order of hundreds of angstroms using the Sneh process can be slow.

As discussed in connection with the Sherman and Sneh patents, above, the ALD process includes cycles of flowing gas reactant into a chamber, adsorbing a layer of gas onto a wafer surface, purging the gas reactant, flowing a second gas reactant into the chamber, and reacting the second gas reactant with the first gas reactant to form a monolayer, or sub-monolayer on the wafer surface. Thick films are achieved by deposition of multiple cycles.

Precise film thicknesses in ALD can be controlled by controlling the number of cycles in the deposition process, since a controlled thickness of material is deposited in each step of the process.

The throughput in terms of the number of substrates that can be processed per unit time in device fabrication environments for conventional ALD systems can be less than 1 wafer per hour in configurations in which single wafers are processed at a time and in which a targeted film thickness is in the range of 10-50 nm. ALD process chambers can be designed with minimal volume to minimize cycle times and maximize throughput, although a reduction in the process volume will not affect the number of cycles required to achieve typical film thicknesses. The characteristic self-limiting surface adsorption reaction of ALD results in a process that is considerably slower than CVD.

SUMMARY

A nanolayer deposition (NLD) process for depositing a thin film uses a thermally activated chemical vapor deposition process and includes evacuating a chamber of gases; exposing a device to a gaseous first reactant, wherein the first reactant deposits on the device or substrate to form a thin film; evacuating the chamber of gases; and exposing the device, coated with the first reactant, to a gaseous second reactant under plasma to treat or modify the thin film deposited by the first reactant to form the desired film.

In a preferred embodiment of the present invention, the NLD process utilizes temperatures that are lower than those that might be used to produce films in conventional, non-pulsed CVD processes. For example, typical titanium-containing thin films are deposited from precursors such as TDMAT at temperatures above at or above 350° C. The lower limit of the electrical resistivity of the resultant films is significantly impacted by residual carbon in the film at a given deposition temperature. Reductions in the carbon can be achieved by increasing the temperature of the substrate upon which the films are deposited although the maximum deposition temperature can be limited by the chemical stability of the precursor in the presence of exceedingly high temperatures. High temperatures can also limit the applicability of the bulk CVD process to applications that can withstand the higher temperatures. Many integrated semiconductor fabrication process flows are limited to temperatures below 350-450° C. after the first metal layers have been applied. In applications in which high aspect ratio features are used, the higher temperature processes can also lead to a reduction in the conformality of the deposited films.

The present invention enables low temperature deposition processes with high conformality. In the example in which TDMAT is used to deposit titanium-based thin films, the substrate temperature can be reduced to the range of 250 to 290° C. during deposition to reduce the sticking coefficient of the precursors resulting in improved step coverage in high aspect ratio features. Films deposited at the lower deposition temperatures, although highly conformal, are generally inferior in film quality due to the incorporation of high concentrations of carbon from the metallo-organic precursors. The ability to treat deposited films in a cyclic manner, as in an NLD process for example, allows for the deposition of thin layers of films with poor film qualities that can be converted to films with highly desirable film properties upon exposure to a plasma. Exposure of conformal titanium-based thin films deposited from TDMAT precursors, to a hydrogen plasma, for example, can result in higher quality titanium films than those deposited at the same temperatures without exposure to a hydrogen plasma. The combination of high conformality relative to PVD, of low deposition temperature relative to CVD, and increased throughput relative to ALD, provides unique advantages of the NLD processes over alternative techniques. The ability to achieve low carbon content and the correspondingly low resistivity using cyclic plasma treatments is also unique to the NLD process.

In the NLD process, the plasma can be generated with an inductively coupled plasma, a microwave coupled plasma, a high pressure plasma, a downstream plasma, or any other source that provides ionized or excited gases to the substrate. The plasma can also be generated using power applied to the substrate with or without one or more sources for plasma generation in addition to the substrate bias power.

The reactant precursors can be metallo-organic or inorganic and can be used to form a thin film of metal, metal nitride, metal oxide, metal fluorides, metal borides, and metal carbides. Various impurities can also be incorporated into these deposited films to produce a wide range of materials. Additionally, laminate structures can be formed that comprise one or more layers, one or more types of layers, and one or more combinations of layers.

An embodiment of an NLD process includes an optional pre-cleaning step to condition the surface of a device or substrate; a first evacuation step to remove residual gases from a process chamber; a stabilization step to introduce a first precursor at a targeted flow rate and pressure; an exposure step for exposing the device to a first reactant, wherein the first reactant deposits on the device or substrate to form a nanolayer thin film having a thickness of approximately one or more atomic layers; a second evacuation step to remove residual first precursors from the process chamber; a second exposure step to expose the device or substrate to a plasma wherein the thin film deposited by the first reactant is treated to modify the film properties or surface properties of the deposited film by one or more of extracting unwanted impurities, incorporating additional or new elements, exchanging elements in the deposited film, and changing the stoichiometry of elements in the layer. Other changes to the film properties, such as electrical or thermal resistivity or crystallinity, among others, might occur concurrently with these changes and remain within the scope of the present invention. Repetition of these steps results in the deposition of a thick film, where the thickness is determined by the number of times the cycle is repeated.

In another embodiment, the deposition steps discussed above can take place in multiple chambers. The optional pre-cleaning step, for example, can be performed in a separate process module prior to insertion of the pre-cleaned substrate into the deposition module.

In yet another embodiment, the process includes pre-cleaning of the device surface; evacuating the chamber; stabilizing precursor flow and pressure; exposing the device to a first reactant, wherein the first reactant deposits on the device to form a nanolayer thin film having a thickness of approximately one or more atomic layers; purging the chamber; and, evacuating the chamber. The device or substrate is then transferred to another chamber that is purged and pumped, and in which the device or substrate is exposed to a plasma treatment; exposing the device, coated with the first reactant in the first chamber, to a gaseous second reactant under the plasma treatment in the second chamber, wherein the thin film deposited by the first reactant is treated to modify the film properties or surface properties of the deposited film by one or more of extracting unwanted impurities, incorporating additional or new elements, exchanging elements in the deposited film, and changing the stoichiometry of elements in the layer. Other changes to the film properties, such as electrical or thermal resistivity or crystallinity, among others, might occur concurrently with these changes and remain within the scope of the present invention. Repetition of this cycle in the first and second chambers deposits a thick film, wherein the thickness of the resulting film depends upon the number of times the cycles are repeated.

In another aspect of the invention, an apparatus to perform semiconductor processing includes a high density inductively-coupled plasma source or other high density plasma source enclosed in a process chamber, wherein a device is exposed inside the chamber to a gaseous first reactant. The first reactant deposits on the device to form a thin film. After purging, the device, coated with the first reactant, is exposed to a gaseous second reactant under plasma, wherein the thin film deposited by the first reactant is treated to modify the film properties or surface properties of the deposited film by one or more of extracting unwanted impurities, incorporating additional or new elements, exchanging elements in the deposited film, and changing the stoichiometry of elements in the layer. Other changes to the film properties, such as electrical or thermal resistivity or crystallinity, among others, might occur concurrently with these changes and remain within the scope of the present invention.

In another aspect of the invention, an apparatus to perform semiconductor processing includes an rf or dc power source that delivers power to the substrate through a substrate support electrode to provide a means for producing a plasma ambient when power is applied to the substrate support electrode, which is enclosed in a process chamber, wherein a device or substrate is exposed inside the chamber to a gaseous first reactant. The first reactant deposits on the device to form a thin film. After purging, the device, coated with the first reactant, is exposed to a gaseous second reactant under plasma, wherein the thin film deposited by the first reactant is treated to modify the film properties or surface properties of the deposited film by one or more of extracting unwanted impurities, incorporating additional or new elements, exchanging elements in the deposited film, and changing the stoichiometry of elements in the layer. Other changes to the film properties, such as electrical or thermal resistivity or crystallinity, among others, might occur concurrently with these changes and remain within the scope of the present invention.

In yet another aspect of the invention, an apparatus to perform semiconductor processing includes a high density inductively-coupled plasma source or other high density plasma source enclosed in a process chamber and an rf or dc power source that delivers power to the substrate through a substrate support electrode to provide a means for producing a plasma ambient when power is applied to the high density plasma source, to the substrate support electrode, or both the high density plasma source and the substrate support electrode which is enclosed in a process chamber, wherein a device or substrate is exposed inside the chamber to a gaseous first reactant. The first reactant deposits on the device to form a thin film. After purging, the device, coated with the first reactant, is exposed to a gaseous second reactant under plasma, wherein the thin film deposited by the first reactant is treated to modify the film properties or surface properties of the deposited film by one or more of extracting unwanted impurities, incorporating additional or new elements, exchanging elements in the deposited film, and changing the stoichiometry of elements in the layer. Other changes to the film properties, such as electrical or thermal resistivity or crystallinity, among others, might occur concurrently with these changes and remain within the scope of the present invention.

The NLD processing method can provide deposition of copper metal from Cu hfacI and plasma (gas), Cu hfacII and plasma (gas), $CuI_4$ and plasma (gas), $CuCl_4$ and plasma (gas), other copper-containing metallo-organic precursors and plasma (gas), and other copper-containing inorganic precursors and plasma (gas) wherein (gas) is one or more of $N_2$, $H_2$, Ar, He, $NH_3$, and combinations thereof. Other hydrogen-containing gases can also be used within the scope of the present invention. Other gases, reactive or inert, can also be combined with one or more of $N_2$, $H_2$, Ar, He, and $NH_3$, and be within the scope of the present invention.

In addition to the deposition of copper metal from copper-containing metallo-organic and inorganic precursors, analogous metal depositions can be achieved using the inventive process for other metals in which metal-containing metallo-organic or inorganic compounds are available.

The NLD processing method can provide deposition of titanium and titanium nitride films from tetrakisdimethyl titanium (TDMAT) and plasma (gas), tetrakisdiethyl titanium (TDEAT) and plasma (gas), tetrakis (methylethylamino) titanium (TMEAT) and plasma (gas), $TiCl_4$ and plasma (gas), $TiI_4$ and plasma (gas), and other titanium-containing metallo-organic precursors and plasma (gas), and other titanium-containing inorganic precursors and plasma (gas) wherein (gas) is one or more of $N_2$, $H_2$, Ar, He, $NH_3$, and combinations thereof. Other hydrogen-containing gases can also be used within the scope of the present invention. Other gases, reactive or inert, can also be combined with one or more of $N_2$, $H_2$, Ar, He, and $NH_3$, and be within the scope of the present invention.

The NLD processing method can provide deposition of tantalum and tantalum nitride from penta-dimethyl-aminotantalum (PDMAT) and plasma (gas), pentakis(diethylamido)tantalum (PDEAT) and plasma (gas), other tantalum-containing metallo-organic precursors and plasma (gas), and other tantalum-containing inorganic precursors and plasma (gas) wherein (gas) is one of $N_2$, $H_2$, Ar, He, $NH_3$, and combinations thereof.

In addition to the deposition of titanium nitrides from titanium-containing metallo-organic and inorganic precursors, and in addition to the deposition of tantalum nitrides from tantalum-containing metallo-organic and inorganic precursors, analogous nitrides of other metals can be achieved using the inventive process for which metal-containing metallo-organic or inorganic compounds are available.

The NLD processing method can provide deposition of titanium oxide and titanium oxinitride films from tetrakisdimethyl titanium (TDMAT) and plasma (gas), tetrakisdiethyl titanium (TDEAT) and plasma (gas), tetrakis (methylethylamino) titanium (TMEAT) and plasma (gas), $TiCl_4$ and plasma (gas), $TiI_4$ and plasma (gas), other titanium-containing metallo-organic precursors and plasma (gas), and other titanium-containing inorganic precursors and plasma (gas) wherein (gas) is one or more of $O_2$, $O_3$, $H_2O$, $N_2O$, $NO_2$, $N_2$, $H_2$, Ar, He, $NH_3$, and combinations thereof. Other oxygen-containing gases can also be used within the scope of the present invention. Other gases, reactive or inert, can also be combined with one or more of $O_2$, $O_3$, $H_2O$, $N_2O$, $NO_2$, $N_2$, $H_2$, Ar, He, $NH_3$, and be within the scope of the present invention.

The NLD processing method can provide deposition of tantalum oxide and tantalum oxinitride from penta-dim-ethyl-amino-tantalum (PDMAT) and plasma (gas), pentakis (diethylamido)tantalum (PDEAT) and plasma (gas), other tantalum-containing metallo-organic precursors and plasma (gas), and other tantalum-containing inorganic precursors and plasma (gas) wherein (gas) is one of $O_2$, $O_3$, $H_2O$, $N_2O$, $NO_2$, $N_2$, $H_2$, Ar, He, $NH_3$, and combinations thereof. Other oxygen-containing gases can also be used within the scope of the present invention. Other gases, reactive or inert, can also be combined with one or more of $O_2$, $O_3$, $H_2O$, $N_2O$, $NO_2$, $N_2$, $H_2$, Ar, He, $NH_3$, and be within the scope of the present invention.

In addition to the deposition of titanium oxide and oxinitrides from titanium-containing metallo-organic and inorganic precursors, and in addition to the deposition of tantalum oxides and oxinitrides from tantalum-containing metallo-organic and inorganic precursors, analogous oxides and oxinitrides of other metals can be deposited using the inventive process for which metal-containing metallo-organic or inorganic compounds are available.

Metal fluorides, metal carbides, and metal borides can also be fabricated using the inventive NLD processes for metals in which metallo-organic or inorganic precursors are available in combination with plasma exposures to fluorine-containing gases, carbon-containing gases, and boron-containing gases respectively. Metal fluorides might be formed, for example, using $SF_6$ or $NF_3$ alone or in combination with one or more of $N_2$, $H_2$, Ar, He, and $NH_3$.

In an aspect of the present invention, methods and apparatuses to perform semiconductor processing, including thin film treatment, includes a substrate preference toward a plasma species. For example, the substrate can be a power electrode, a bias electrode, or in general, the substrate can exhibit a tendency to attract the plasma species to move toward the substrate. In an embodiment, the plasma comprises a combination of isotropic and preferential species for optimizing a film treatment. For example, the plasma treatment can comprise an inductively coupled plasma together with a powered electrode, with the ratio of applied power between the source and the biased electrode dependent on the desired outcome of the intended process.

Implementations of the apparatus can include gas distribution, chuck, vaporizer, pumping port to pump, and port for gas purge.

The resulting deposition from NLD processes can be highly conformal and similar in quality to that of ALD. Nanolayer thick films deposited using NLD processes have been found to provide near-100% conformality (ratio of the thickness at the bottom of feature to the thickness at the top of a feature) on high aspect ratio topographies. Further, such conformality is achieved at a higher deposition rates than with ALD, since multiple atomic monolayer can be deposited in each NLD cycle. In contrast, ALD processes typically deposit less than a monolayer per cycle resulting in a comparatively lower throughput.

Additionally, the lower temperatures of the NLD deposition process, relative to that of conventional CVD, is consistent with the processing requirements of advanced films, such as low-k intermetal dielectrics.

The precursors or gases usable in the NLD process are not limited to those having self-limiting surface reactions, since NLD is a deposition process. NLD thus employs a much broader spectrum of precursors and can be used to deposit a wide range of film materials from a variety of available precursors.

DESCRIPTION

Figure 1:
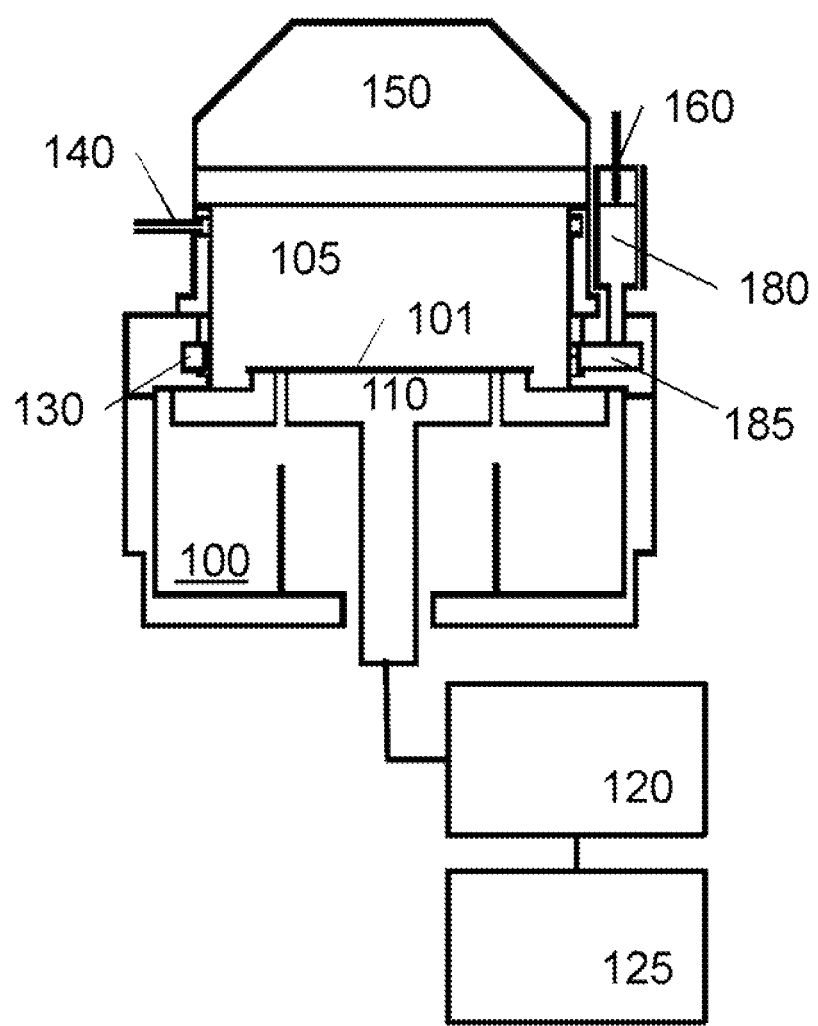
FIG. 1 shows an exemplary embodiment of a plasma processing system.

FIG. 1 shows an exemplary plasma processing system 100 with a processing volume 105. The process chamber 105 has a chamber body enclosing components of the process chamber such as a chuck 110 supporting a substrate 101. The process chamber typically maintains vacuum and provides a sealed environment for process gases during substrate processing. Metallo-organic precursors 180 are provided from ampoule 160 through a valve 185 to process chamber volume 105. Plasma treatment gases are provided through gas inlet 140 to chamber volume 105. Optional plasma source 150 is shown at the top of processing system 100 although other configurations or placements of plasma source 150 could be implemented within the scope of the present invention. Bias power supply 125 is connected to the substrate electrode through matching network 120.

The process chamber periodically must be accessed to clean the chamber. An opening typically is provided for maintenance at the top of the process chamber that is sufficiently large to provide access to the internal components.

In an embodiment, the present invention discloses an NLD process, comprising depositing a non self-limiting layer and treating the deposited layer with a plasma. Each deposition and treatment step will produce a thin layer of film that is typically a fraction of the overall thickness required for a typical end-use application. These deposition and treatment steps can be repeated, however, until a desired thickness is achieved. A favorable characteristic of the NLD process is the non-self-limiting characteristic of the deposition step. Unlike ALD, in which the deposition of precursors proceeds through adsorption of a monolayer of gaseous species onto a substrate, and in which the deposition of precursors is largely independent of process parameters, the deposition of precursors in the NLD process is highly dependent on process parameters such as the deposition time, the flow rate and pressure of precursors, and the substrate temperature. Additionally, in NLD, the precursors in the plasma treatment step do not substantially interfere or react with the precursors in the deposition step although optional evacuation or purging steps can be performed between the deposition and treatment steps. Conversely, in ALD, a second set of precursors are often introduced to react with the first set of precursors to produce the desired characteristics in the deposited film.

The deposition step in the present invention is not self-limiting, which, in an embodiment, is similar to a CVD process using a first set of precursors. The optimum thickness for NLD processing is typically the thickest layer per cycle that can be treated during the treatment step, for example, from sub nanometer to many nanometers although throughput considerations must be taken into account in determining reasonable durations for the treatment steps. The ability to increase the thickness per cycle allows the NLD process to use fewer cycles in comparison to ALD for the same total film thickness, leading to a faster process times and higher wafer processing throughput. The plasma treatment step modifies the already deposited layer characteristics, using precursors such as oxygen, ammonia, fluorine, carbon, boron, nitrogen, hydrogen, or inert gas such as argon or helium. Examples of the plasma treatment process include treatment of a whole or a portion of the deposited layer; modification of film composition (for example, forming a nitrogen-rich nitride film); and an incorporation, substitution, or removal of impurities from the deposited film.

An aspect of the present invention is the plasma characteristics. An isotropic plasma (e.g., non-directional) can react equally in all directions, thus allowing similar treatment of sidewall surfaces in a high aspect ratio trench as compared to the preferential treatment of only the top and bottom planar surfaces. Examples of isotropic plasmas include high pressure plasmas, inductive coupled plasmas, remote plasmas, and microwave plasmas.

In an embodiment, the present invention discloses a plasma treatment with plasma having a substrate preference toward a plasma species. For example, the substrate can be powered with a bias source such as power source, a voltage source, or in general, the substrate can exhibit a tendency to attract the plasma species to move toward the substrate. In an embodiment, the substrate can be powered or biased with a DC or RF power source. In an embodiment, the substrate can be powered or biased with a DC or AC voltage source. For example, the substrate can be disposed on a positive or negative electrode of a bias source such as an RF generator. Applying power to the substrate support can produce a plasma near the substrate that furnishes ions guided to the substrate surfaces during the treatment process, attracting reactive species in the plasma toward the substrate, thus can lower the power or time requirement to treat the film.

Figure 2:
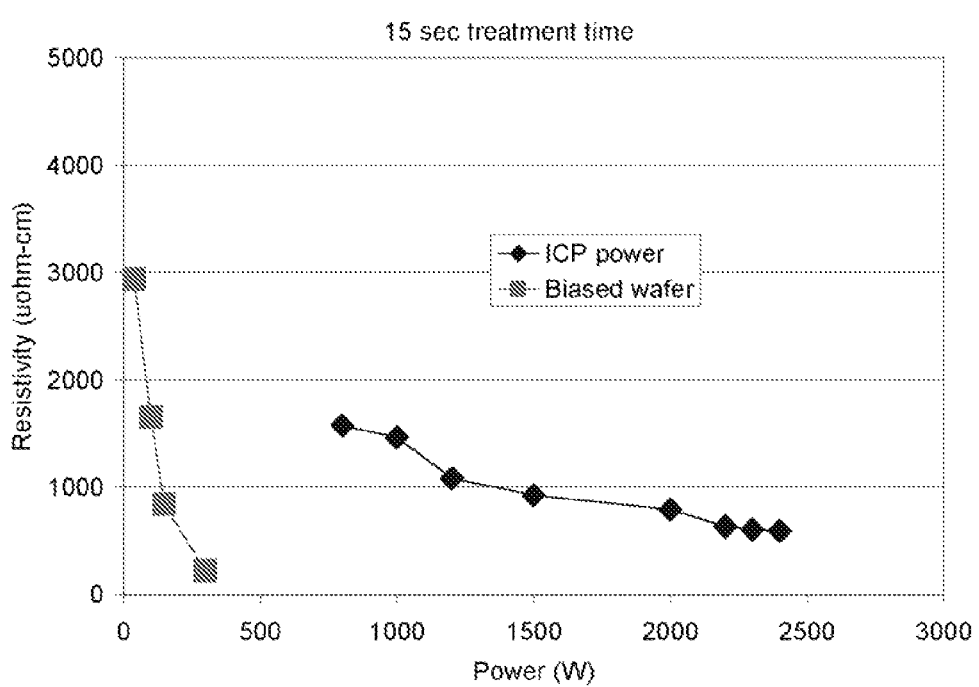
FIG. 2 shows a plot of measured film resistivity versus plasma treatment power.

FIG. 2 illustrates a comparison of an ICP plasma treatment versus a bias treatment for a TiN film deposited with a TDMAT precursor. Values of the low resistivity were targeted for the processes used to produce the data shown in FIG. 2. For a fixed 15 second time treatment, the TiN film achieves a desired resistance with much lower power requirement and faster resistance convergence for the bias power than for the ICP power without bias. For example, to achieve a resistance of 600 Ohm/square, a bias power of 200 W is needed, as compared to a power of 2500 W for the ICP source without the bias. In addition, plasma treatment with a bias substrate can achieve TiN films with low resistivity values that are not as practical with an ICP source alone. For example, to achieve a resistance of 250 Ohm/square, a bias power of 300 W is needed while the power requirement for the remote ICP source without the addition of bias power is projected to be higher than tens of kW. In addition to the reduction in the required power, the treatment with bias can reduce the exposure time to the plasma ambient to achieve the same, or better, characteristics of the film.

In an embodiment, the plasma comprises a combination of isotropic and preferential species with a ratio selected for a film treatment optimization. For example, the plasma treatment can comprise an inductively-coupled plasma together with a powered electrode (by a power source or a voltage source), with a ratio of applied source to bias powers dependent on the desired deposited film characteristics. In an embodiment, the bias power is selected to achieve a desired film characteristic such as a specific value or range of stoichiometry in the deposited film, or a specific value or range of values for the electrical resistance in the deposited film, for example. The ICP plasma is selected to achieve a conformal treatment of the pattern, such as an equal treatment on the sidewalls as compared to a top or bottom of the pattern.

The advantages of applying a substrate bias during all or part of a process that is intended to deposit a film is not immediately obvious but has been found to produce favorable results in certain situations and in certain ranges of applied bias power in the inventive process for the deposition of a wide range of materials.

In an embodiment, high frequency rf power is utilized for the substrate bias. In an embodiment, the frequency of the power applied to the substrate is 0.1 MHz. In yet another embodiment, the frequency of the power applied to the substrate is in the range of 1-4 MHz. In yet another embodiment, the frequency of the power applied to the substrate is 13.56 MHz. In yet another embodiment, the frequency of the power applied to the substrate is 27.12 MHz. In yet another embodiment, the frequency of the power applied to the substrate is 40.68 MHz. In yet other embodiments, the frequency of the power applied to the substrate is in the range of 0.1 to 100 MHz. As the frequency of the power applied to the substrate increases over a certain range, changes in plasma characteristics can improve the process results. For example, for capacitive plasma, ion density increases with higher plasma frequency, as well as the power efficiency ratio, e.g., the ratio of plasma generation power to power consumed for ion acceleration. In addition, the plasma density at the plasma sheath boundary increases with higher frequency and pressure, while the sheath thickness decreases with higher frequency.

In embodiments in which a bias is applied to a substrate in which one or more sources for plasma generation are used, bias frequencies in the range of 0.1 to 1 MHz may be preferable for some applications since little or no ion generation from the substrate bias power may be required. The efficiency of plasma generation for rf power in the range of 0.1 to 1 MHz is lower than frequencies greater than 1 MHz. In general, higher frequencies produce higher ion densities per watt of applied power in capacitively coupled systems as in the case of power applied to a substrate electrode. Conversely, in embodiments in which power is applied only through the substrate, frequencies at or above 1 MHz to 100 MHz can be used depending on the response of the film to ion density and ion energy. For applications that are driven by higher ion energies, lower frequencies may be preferred. For applications that are driven by higher densities, higher frequencies may be preferred.

In an embodiment in which an inductively coupled power source is utilized in combination with a bias power source, the use of bias frequencies in the range of 0.1 to 1 MHz may be preferred to minimize the required bias power required to preferentially direct ions to the substrate and to produce a wider distribution in incident ion energies at the surface of the growing film. Alternatively, in embodiments in which the applied power is limited to a power source applied to the substrate, frequencies greater than 1 MHz are preferred. High frequency biasing can provide ions at lower energy levels, reducing potential sputtering of the substrate due to ion bombardment. In general, increasing the frequency of the bias power source reduces the ion energy at the wafer surface as a higher percentage of the power is utilized in ion generation. Thus, increases in bias frequency generally allow for higher power levels to be applied to the substrate with the corresponding increase in the flux of ions to the substrate, without increasing the energy of incident ions.

Figure 3:
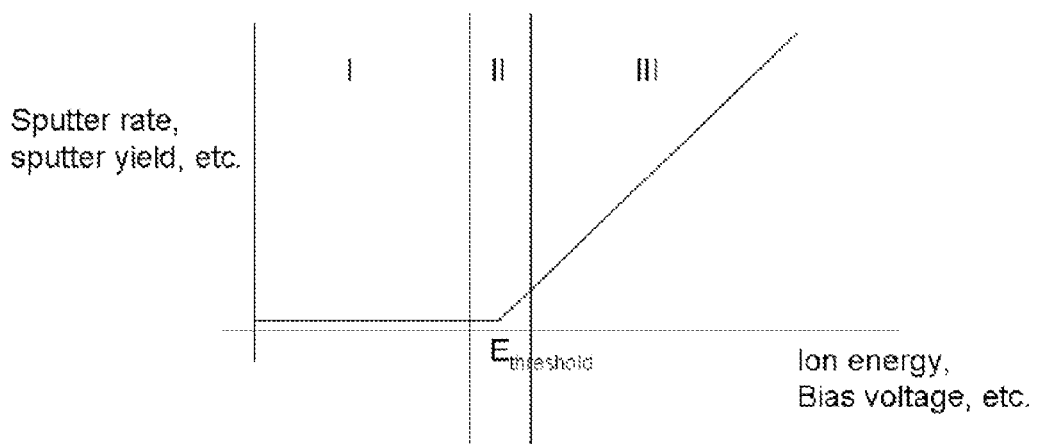
FIG. 3 shows three regimes of sputtering rates for an ionized gas impinging on a substrate: I) sub-threshold regime, II) near-threshold regime, and III) above-threshold regime.

Control of the ion energy via control of the applied power to the substrate provides for an improvement in the plasma treatment of the deposited layer by providing for operation in a range of ion energies that facilitates improved and accelerated treatments without the deleterious effects of excessive sputtering. FIG. 3, shows the expected behavior for the sputter rate or sputter yield for a material exposed to an incident flux of ions. At low power levels, the sputter rate is low or near zero nm/min and linearly increases with increasing bias power or ion energy above a threshold value. The flux of ions can be from an inert gas such as for example, argon, helium, or other noble gas, or from a reactive gas such as nitrogen, oxygen, hydrogen, ammonia, or other gas containing oxygen, nitrogen, hydrogen, fluorine, or boron. In general, the sputtering threshold for reactive gases that result in the formation of oxides, nitrides, fluorides, borides, and carbides is considerably higher than for non-reactive gases. For hydrogen, the sputtering threshold is also expected to be higher for most films in comparison to, argon for example, due to the lighter mass of the hydrogen molecule.

In the general representation for sputter rate shown in FIG. 3, three specific regimes are identified: I) sub-threshold regime, II) transition regime, and III) above-threshold regime. The ordinate of the graph in FIG. 3 is the ion energy, applied bias power, bias voltage, or other measure or parameter pertaining to the energy of incident ions impinging on the substrate. The abscissa of the graph in FIG. 3 is the sputter rate, etch rate, sputter yield, etch yield or other measure or parameter pertaining to the removal of material from the substrate.

For ion energies below the sputter threshold, as in the sub-threshold regime shown in FIG. 3, little or no material is removed from the substrate. In this regime, the substrate can, in general, be exposed for long durations with little or no removal of material from the surface of the substrate. Operation at bias power levels below the sputtering threshold allows for exposure of the substrate to ions that are formed in close proximity to the substrate to maximize the effectiveness of the available ion concentration and flux while minimizing losses that can occur with remote plasma sources, yet with ion energies that will not sputter the substrate. The combination of high plasma densities and low ion energies provided with the use of applied substrate bias power levels below the sputter threshold provides a unique reactive environment for modifying the properties of thin films as required, for example, in the plasma treatment step of an NLD process.

The sub-threshold regime shown in FIG. 3 can be highly effective for removing undesired impurities from the exposed surface of the substrate as in the case of a film deposited during the deposition cycle of an NLD process. In the case of a nitrogen plasma treatment of a titanium-based precursor film deposited from TDMAT, for example, excess carbon is more easily removed from the growing film than titanium. The decrease in resistivity of a TiN film deposited using the NLD approach is known to correspond to the reduction in the carbon concentration that results from plasma exposure during the plasma treatment steps of the cyclic NLD process. In the graph shown in FIG. 3, separate sputter rates are anticipated for carbon and titanium. Desired operation for a plasma treatment step in an embodiment might then be below the sputter threshold for titanium yet above the sputter threshold for carbon in embodiments in which operation below the threshold for titanium is preferred. In some embodiments in which a constituent of an as-deposited film is removed, or in which a film is densified, the resulting film thickness after treatment using sub-threshold ion energies may appear to have been reduced relative to the thickness of the film immediately following the deposition step. In these cases, however, the thinning of the films will be self-limiting in that for long treatment times, only a fraction of the deposited films will appear to have been removed. This small reduction in film thickness might be observed, for example, in the case where carbon is removed from a layer deposited from TDMAT precursors in which a titanium film is desired, using hydrogen to extract the carbon and other impurities. The densification of the titanium and removal of the carbon may result in a thinner film than that observed immediately after the deposition step giving the appearance of an apparent sputter rate. Removal of material during an initial part of the treatment cycle can occur for ion energies below the sputter threshold but complete removal of the entire thickness of deposited film from the deposition step that precedes the treatment step will not occur if the energy of the incident ions is below the sputter threshold.

The bombarding ions in the sub-threshold regime shown in FIG. 3 can treat the deposited layer, can clean the deposited layer surface, can locally increase the layer temperature to promote changes in film properties, can preferentially sputter weak and non-equilibrium structures from the film, and can produce densification through compaction, among other effects. In an embodiment, the bias power is restricted to below the sputtering threshold power, or to the vicinity of the sputtering threshold power.

Below the sputtering threshold, the ion energy can increase with increasing bias power but the ions do not have sufficient energy to sputter material from the surface, so the dominant effect of increasing bias power in this regime is to increase plasma generation above the substrate. At, and around the sputter threshold, the effectiveness of the plasma treatment can undergo significant changes. Above the threshold power, the sputtering component dominates.

In the second regime shown in FIG. 3, the transition regime, some sputtering of the substrate might be expected. In general, the incident ions have a distribution of energies and the threshold may not be as well-defined as FIG. 3 shows. In an embodiment in which a plasma treatment in an NLD process uses bias power in the vicinity of the sputter threshold for the deposited film, the higher ion energies relative to the sub-threshold regime can result in increased reactivity and compaction, and therefore in reduced treatment times. In this transition regime, the sputtering is not sufficient to result in the removal of the thin film that was deposited during the deposition step of the cyclic NLD process yet can be sufficient to enhance or accelerate the conversion of the deposited film from the characteristics of the as-deposited film to the characteristics of the desired film. It is possible that some portion of the film that was deposited in the deposition step of the cyclic NLD process is removed, or reduced in thickness due to compaction or other effect, during treatment steps that use incident ion energies in the vicinity of the sputtering threshold.

The third regime shown in FIG. 3 is the regime in which ion energies exceed the sputter threshold for a combination of the materials in the growing film and the type of incident ions or ionized gas mixture. In this regime, the bias power applied to the substrate exceeds the sputter threshold and can quickly result in a complete loss of a thin layer of deposited film. Application of a bias in this regime must be sufficiently short in duration so as to not remove the film deposited during the deposition step. Alternatively, pulsed bias power can be applied to the substrate so that exposures to high ion energies can be utilized for short durations to enhance or accelerate the effectiveness of the plasma treatment without complete removal of the deposited film.

In an embodiment, pulsed power is utilized in biasing the substrate. The biasing can be applied by imposing a power or voltage in pulse form on the substrate. The pulse period, pulse width, and pulse height are controlled to optimize the treatment process, such as controlling the directionality, density and energy of incident ions on the substrate.

In an embodiment, the pulsed bias power comprises pulses for plasma generation. Alternatively, the pulse waveform can comprise a pulse for plasma generation and ion incidence and a pulse for relaxation in which the amplitude and in some cases, the polarity differs from that of the pulse for ion incidence. In an exemplary embodiment, the plasma treatment time is ten seconds in duration, the duty cycle is 150 microseconds with a duration in the pulsed "high" or "on" state of 100 microseconds at a power level in this "on" state of 100 W, and with a duration of 50 microseconds in the pulsed "low" or "off" state of 0 W. Pulsing between the high and low states of 100 W and 0 W, respectively, is repeated throughout the duration of the ten second plasma treatment.

In embodiments in which the bias power is very low or zero watts in the "low" state of a pulsed bias power operational mode, the treatment is more isotropic leading to more effective treatment of vertical sidewalls in device features on a substrate.

In yet another exemplary embodiment, the plasma treatment time is eight seconds in duration, the duty cycle is 120 microseconds with a duration in the pulsed "high" or "on" state of 80 microseconds at a power level in this "on" state of 120 W, and with a duration of 40 microseconds in the pulsed "low" or "off" state of 25 W. Pulsing between the high and low states of 120 W and 25 W, respectively, is repeated throughout the duration of the eight second plasma treatment.

In yet another exemplary embodiment, the plasma treatment time is five seconds in duration, the duty cycle is 100 microseconds with a duration in the pulsed "high" or "on" state of 50 microseconds at a power level in this "on" state of 200 W, and with a duration of 50 microseconds in the pulsed "low" or "off" state of 30 W. Pulsing between the high and low states of 200 W and 30 W, respectively, is repeated for half of the overall number of cycles required to produce the desired overall thickness of deposited film and for the second half of the cycles required to produce the overall film thickness, the high and low power levels are increased from 200 W and 30 W to 220 W and 50 W, respectively.

The durations and values provided in these examples are not intended to restrict the ranges or magnitudes of the inventive process but rather are provided as illustrative examples of settings that might be utilized in a plasma treatment process using pulsed bias power in an NLD process.

In an embodiment, the pulse period is less than about 1 msec or less than 100 microseconds, and the duty cycle is greater than 50%, or greater than about 75%.

In an embodiment, the bias comprises alternating between high power and low power values. For example, the high bias portion of the cycles couple sufficient power into the plasma to produce a high density of ions. The low cycles allow electrons to cool to reduce the average random (thermal) electron velocity in the plasma. The low portion of the cycle is limited in duration as necessary to limit the loss of plasma. Also, during the low power portion of the cycles, the power may be off.

Multiple high or low states can also be used and be within the scope of the present invention. An exemplary combination of bias power of 250 W, 100 W, and 0 W, for corresponding durations of 20, 100, and 50 microseconds, respectively, could be utilized within the scope of the present invention. In this example, if the observed sputter threshold for the combination of deposited thin film treatment gas is 120 W, then the high bias power of 250 W for 20 microseconds would exceed the sputter threshold and result in the potential removal of a portion of the film that was deposited in the preceding deposition cycle. An objective in this exemplary embodiment would be to ensure that the thickness of the deposited film exceeds the thickness that was removed during the portion of the cycle in which the bias power is at 250 W. Some advantages of operating beyond the sputter threshold are the potential acceleration and enhancement of the treatment process from the high ion energies that are not available at lower power levels or that require much longer durations at low power levels. As the power level is reduced to 100 W, at which point the power is below the sputter threshold of the deposited film, the process can proceed without further sputtering or removal of the remaining film thickness. Further densification, compaction, and extraction of impurities, in addition to other benefits imposed by the treatment process can proceed. After 100 microseconds at 100 W, the power level is further reduced to 0 W. In this part of the treatment cycle, the sheath collapses and ion energies can be reduced to the extent that the ions are nearly isotropic to enhance the treatment of vertical sidewalls of features on the substrate.

The above examples are provided to highlight typical process times and some of the benefits of the inventive process associated with the variations in the process parameters. Other exemplary embodiments include the use of other combinations of the number of power levels used in the treatment steps, variations in the magnitude of the power levels, variations in the duration at each power level, and variations in other parameters such as gas pressure, gas flow rates, gas mixtures, gas mixture ratios, substrate temperature, and other parameters that can be varied in coincidence with the power level. Additionally, the power level need not be varied in discrete steps but rather can be varied, for example, in a sinusoidal manner, in a monotonically increasing manner, in a monotonically decreasing manner, or in any combination of sinusoidal, monotonically increasing, and monotonically decreasing manners in which bias power is applied at one or more levels for the purpose of modifying the film properties of the deposited film.

The directionality of ions will be reduced as the sheath collapses in embodiments in which the power level is reduced to low or near-zero values. In these cases, a means for varying the average directionality is provided. Reduced directionality provides for improved treatment of the sidewalls in high aspect ratio features on the substrate.

Variation in the high bias or high power portion of the duty cycle provides a means for accelerating or enhancing the treatment of the deposited film. For example, the use of high powers for short durations can allow for brief excursions at high ion energies beyond the sputter threshold shown in FIG. 3, for example, that would otherwise result in excessive removal of the deposited film in a non-pulsed mode. Additionally, multi-state pulsing can be used with two or more pulse states as a means to optimize film quality, throughput, and other characteristics of the deposition process and film properties.

In an exemplary embodiment in which the sputter threshold is 200 W, the high state of the duty cycle is 300 W for a duration of 50 microseconds and the low state of the duty cycle is 5 W for 30 microseconds.

Variations of pulsed plasma can be used, such as multiple pulses followed by a low cycle or an off cycle.

The use of low power or no power in the low portion of a pulsed plasma cycle may also reduce charge buildup by reducing the electron kinetic energy and hence the accumulated charge on exposed surfaces. The low/off cycles reduce the average electron thermal velocity in the plasma, so fewer electrons overcome the plasma sheath and accumulate on substrate or mask layer surfaces. As the plasma cools, the sheath potential and width decrease which causes the plasma to approach closer to the substrate surface and reduces the voltage to which electron charges accumulate on elevated (resist-covered) surfaces. Thus, alternating the bias can reduces the charge buildup on substrate surfaces, as it reduces the floating potential.

In an embodiment, the pulse durations are in the range of 10 s to 100 s of microseconds. In yet another embodiment, the pulse durations are in the range of tens to hundreds of milliseconds. In yet another embodiment, the pulse durations are in the range of tenths of a second to tens of seconds, particularly when the "low" state of the bias power level is non-zero.

In an embodiment, the plasma treatment process includes time dependent process conditions such as pressure, gas ratio, flow, bias properties such as bias frequency, bias duty cycle, bias power level, etc.

In an embodiment, the film of oxides, such as inorganic oxides and metal oxides, nitrides, such as inorganic nitrides and metal nitrides, fluorides, such as inorganic fluorides and metal fluorides, borides, such as inorganic borides and metal borides, carbides, such as inorganic carbides and metal carbides, and any combinations thereof, can be formed by the present NLD process.

Figure 4:
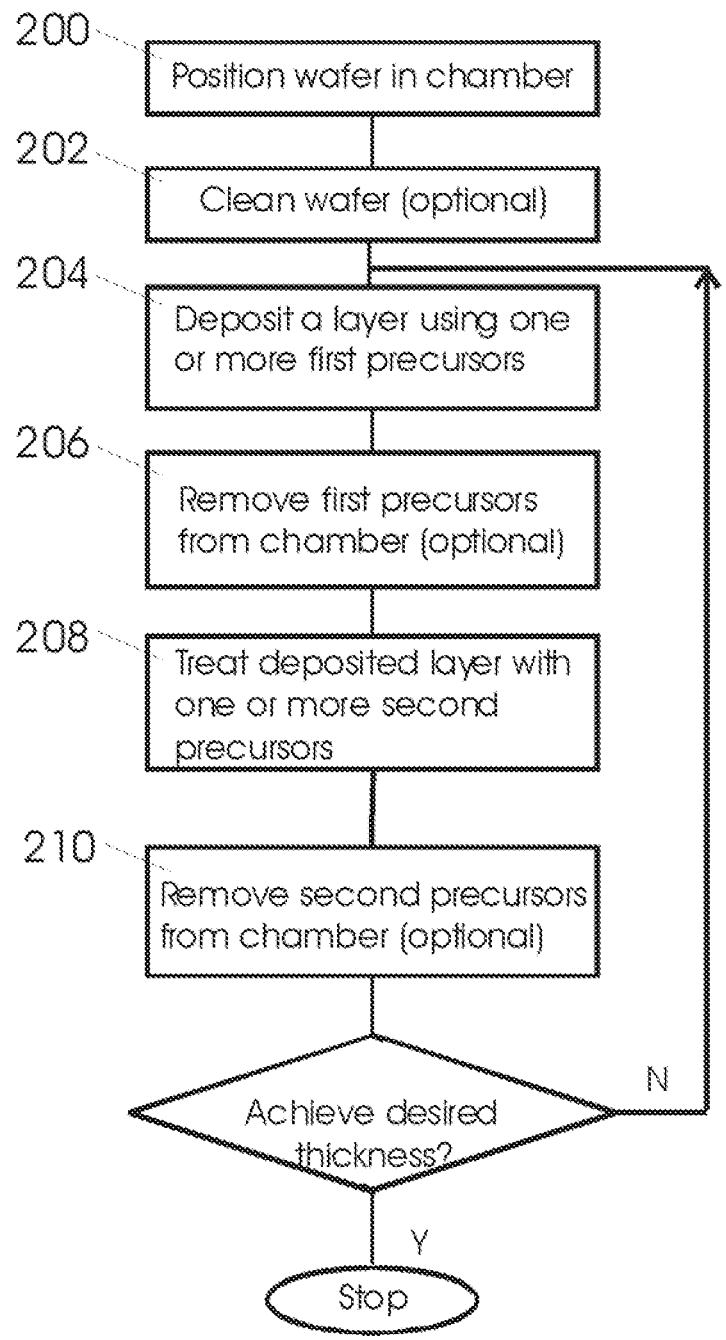
FIG. 4 shows a flowchart of one exemplary semiconductor manufacturing process using the system of FIG. 1.

FIG. 4 shows a flowchart of one exemplary semiconductor manufacturing process using the system 100 of FIG. 1. First, a wafer is positioned 200 inside the evacuated chamber volume 105. Next, an optional cleaning process 202 is performed to condition the substrate surface. A processing gas or mixture of gas consisting of one or more metalloorganic precursors and one or more diluents such as nitrogen, oxygen, argon, or helium, for example is introduced 204 into the chamber 105 to pressurize the chamber to a pressure level such as 5 mT. The pressure level can range between about one millitorr (1 mT) to about ten ton (10 T).

At the conclusion of the deposition of a layer of material in precursor deposition step 204, the gas in the chamber is removed 206. Second precursors are introduced 208 to the chamber 105 to pressurize the chamber volume with a plasma treatment gas or mixture of gases to a pressure in the range of 1 mT to 10 Torr. The substrate is then exposed to the plasma treatment 208. After plasma treatment 208, the chamber volume 105 is again evacuated 210 and the cyclic process is repeated for the number of cycles required to produce a desired film thickness.

In another embodiment, thin film is deposited using chemical vapor deposition by evacuating a chamber of gases; exposing a part to be coated to a gaseous first reactant, wherein the first reactant deposits on the part to form the thin film; evacuating the chamber of gases; exposing the part coated with the first reactant, to a gaseous second reactant of plasma, wherein the plasma treatment modifies the first reactant, wherein the thin film is treated; and, evacuating the chamber of gases.

Figure 5:
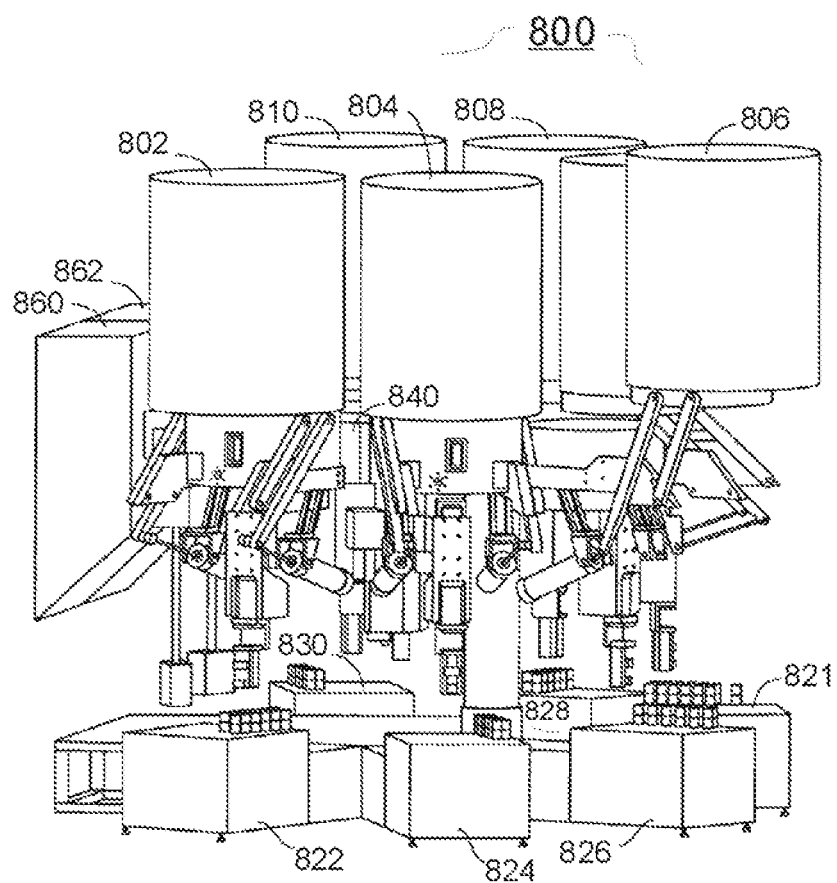
FIG. 5 shows a multi-chamber semiconductor processing system.

In FIG. 5, a multi-chamber semiconductor processing system 800 is shown. The processing system 800 has a plurality of chambers 802, 804, 806, 808 and 810 adapted to receive and process wafers. Controllers 822, 824, 826, 828 and 830 control each of the chambers 802, 804, 806, 808 and 810, respectively. Additionally, a controller 821 controls another chamber, which is not shown.

Each of chambers 802, 804, 806, 808, and 810 has a lid over each chamber body. During maintenance operations, the lid can be actuated into an open position so that components inside the chamber bodies can readily be accessed for cleaning or replacement as needed.

The chambers 802, 804, 806, 808, and 810 are connected to a transfer chamber (not visible) that receives a wafer. The wafer rests on top of a robot blade or transfer arm (not depicted). The robot blade receives wafer from an outside processing area.

The transport of wafers between processing areas entails passing the wafers through one or more doors separating the areas. The doors can be load lock chambers 860 and 862 for passing a wafer-containing carrier or wafer boat that can hold about twenty-five wafers in one embodiment. The wafers are transported from the container loaded into loadlocks 860 and 862 to the process chambers 802, 804, 806, 808, and 810.

Each load lock chamber 860, 862 is positioned between sealed opening (not visible), and provides the ability to transfer semiconductor wafers between fabrication areas. The load locks 860, 862 can include an air circulation and filtration system that effectively flushes the ambient air surrounding the wafers. Gases within each load lock chamber 860, 862 can also be purged during wafer transfer operations, significantly reducing the number of airborne contaminants. The load lock chambers 860, 862 can also include pressure sensors that take air pressure measurements for control purposes.

During operation, a wafer cassette is loaded at openings in front of the system to a load lock through the load lock doors. The doors are closed, and the system is evacuated to a pressure as measured by the pressure sensors. A slit valve (not shown) is opened to allow the wafer to be transported from the load lock into the transfer chamber. The robot blade takes the wafer and delivers the wafer to an appropriate chamber. A second slit valve opens between the transfer chamber and process chamber, and wafer is placed inside the process module 100 onto substrate holder 110.

In an exemplary system 800, substrate temperature control provides temperature control through reliable real-time point temperature measurements with a closed-loop temperature control system. The control portion is implemented in a computer program executed on a programmable computer having a processor, a data storage system, volatile and non-volatile memory and/or storage elements, at least one input device, and at least one output device.

Each computer program is stored in a machine-readable storage medium or device (e.g. program memory or readable disk) readable by a general or special purpose programmable computer, for configuring and controlling operation of a computer when the storage media or device is read by the computer to perform the processes described herein. The present invention may also be considered to be embodied in a computer-readable storage medium, configured with a computer program, where the storage medium so configured causes a computer to operate in a specific and predefined manner to perform the functions described herein.

Figure 6:
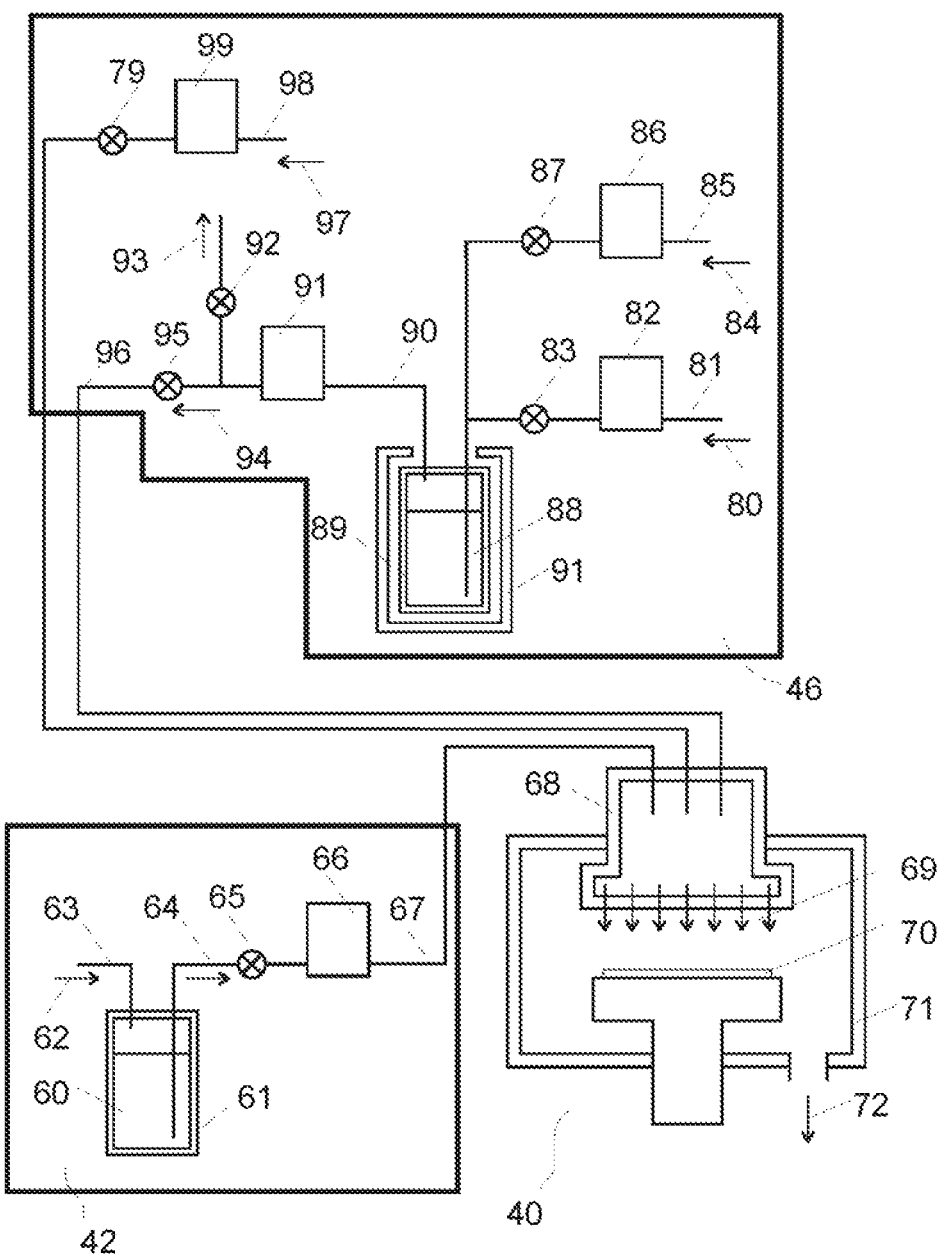
FIG. 6 shows a diagram of an exemplary apparatus for liquid and vapor precursor delivery.

FIG. 6 shows an exemplary apparatus for liquid and vapor precursor delivery using system 100. The apparatus includes a chamber 40 that can be a CVD or NLD chamber. The chamber 40 includes a chamber body 71 that defines an evacuable enclosure for carrying out substrate processing. The chamber body 71 has a plurality of ports including at least a substrate entry port that is selectively sealed by a slit valve and a side port through which a substrate support member can move. The apparatus also includes a vapor precursor injector 46 connected to the chamber 40, and a liquid precursor injector 42 connected to the chamber 40.

In the liquid precursor injector 42, a precursor 60 is placed in a sealed container 61. An inert gas 62, such as argon, is injected into the container 61 through a tube 63 to increase the pressure in the container 61 to cause the liquid precursor 60 to flow through a tube 64 when a valve 65 is opened. The liquid precursor 60 is metered by a liquid mass flow controller 66 and flows into a tube 67 and into a vaporizer 68, which is attached to the CVD or NLD chamber 40. The vaporizer 68 heats the liquid causing the precursor 60 to vaporize into a gas 69 and flow over a substrate 70, which is heated to an appropriate temperature by a susceptor to cause the vaporized precursor 60 to decompose and deposit a layer on the substrate 70. The chamber 40 is sealed from the atmosphere with exhaust pumping 72 and allows the deposition to occur in a controlled partial vacuum.

In the vapor precursor injector 46, a liquid precursor 88 is contained in a sealed container 89 which is surrounded by a temperature controlled jacket 91 and allows the precursor temperature to be controlled to within 0.1 degrees Celsius. A thermocouple (not shown) is immersed in the precursor 88 and an electronic control circuit (not shown) controls the temperature of the jacket 91, which controls the temperature of the liquid precursor and thereby controls the precursor vapor pressure. The liquid precursor can be either heated or cooled to provide the proper vapor pressure required for a particular deposition process. A carrier gas 80 is allowed to flow through a gas mass flow controller 82, when valve 83 and either valve 92 or valve 95, but not both, is opened. Also shown are one or more additional gas mass flow controllers 86 to allow additional gases 84 to also flow when valve 87 is opened, if desired. Additional gases 97 can also be injected into the vaporizer 68 through an inlet tube 98 attached to valve 79, which is attached to a gas mass flow controller 99. Depending on its vapor pressure, a certain amount of precursor 88 will be carried by the carrier gases 80 and 84, and exhausted through tube 93 when valve 92 is open.

After the substrate has been placed into the chamber 40, it is heated by a heater. Electrostatic or mechanical clamping, typical of processing systems used to process semiconductor wafers can be used to facilitate temperature stabilization in a timely manner. After the substrate has reached an appropriate temperature, valve 92 is closed and valve 95 is opened, allowing the carrier gases 80 and 84 and the precursor vapor to enter the vaporizer 68 through the attached tube 96. Once the precursor 88 is vaporized, it is carried through the mass flow controller 91. Such a valve arrangement prevents a burst of vapor into the chamber 40. A vapor distribution system, such as a showerhead 68 or a distribution ring (not shown), is used to evenly distribute the precursor vapor over the substrate 70. After a predetermined time, depending on the deposition rate and the thickness required for the initial film deposition, valve 95 is closed and valve 92 is opened. The flow rate of the carrier gas can be accurately controlled to within 1 sccm and the vapor pressure of the precursor can be reduced to a fraction of an atmosphere by cooling the precursor 88. Such an arrangement allows for accurately controlling the deposition rate to <10 angstroms per minute, if so desired.

The substrate 70 is positioned inside the chamber 200. A first precursor or set of precursors is introduced into the chamber through the showerhead or gas inlets 68 to deposit a layer 204 onto heated substrate 70. After deposition of a layer using one or more first precursors 204, the first precursors are evacuated, purged, or otherwise removed from the chamber 206. A second precursor or set of precursors is then introduced 208 in a plasma ambient to treat or modify the layer. After plasma treatment 208, the gas in the chamber is purged, evacuated, displaced, or otherwise removed and the cyclic process 300 is repeated until the desired thickness is achieved.

In an exemplary embodiment using the inventive process, titanium nitride is deposited using TDMAT as a first precursor, and nitrogen plasma for a second precursor. A typical process recipe for depositing titanium nitride is detailed below:

| Process | step | time | function | Pressure (T) | carrier | liquid | $N_2$ | plasma | $H_2$ | chuck |
|---|---|---|---|---|---|---|---|---|---|---|
| Pre-clean | 1 | 4 s | Pump | 0 | 0 | 0 | 0 | 0 | 0 | up |
|  | 2 | 3 s | Strike | 0(<100 mT) | 0 | 0 | 5 | 1200 | 0 | up |
|  | 3 | 15 s | Plasma | 0.4 | 100 | 0 | 5 | 1200 | 0 | up |
| deposition | 4 | 10 s | Stab | 1.5 | 100 | 10 | 0 | 0 | 0 | up |
|  | 5 | 6 s | dep1 | 1.5 | 100 | 10 | 0 | 0 | 0 | up |
|  | 6 | 3 s | Purge | 0 | 100 | 0 | 0 | 0 | 0 | up |
|  | 7 | 3 s | Pump | 0 | 0 | 0 | 0 | 0 | 0 | up |
|  | 8 | 3 s | Strike | 0 | 0 | 0 | 5 | 1200 | 0 | up |
|  | 9 | 30 s | plasma1 | 0.4 | 100 | 0 | 5 | 1200 | 0 | up |
|  | 10 |  | loop to step 4 (stab) |  |  |  |  |  |  |  |

| Process | step | time | function | Pressure (T) | carrier | liquid | N₂ | plasma | H₂ | chuck |
|---|---|---|---|---|---|---|---|---|---|---|
| Cooling | 11 | 1 s | Plasma off | 0 | 100 | 0 | 0 | 0 | 0 | up |
| | 12 | 30 s | Cool | 0 | 100 | 0 | 0 | 0 | 0 | down |

Steps 1-3 relate to pre-cleaning of the substrate surface. In these steps, the chamber is brought to a low pressure by evacuation pumping for 4 seconds. Next, the plasma is ignited in a strike step and allowed to stabilize for 3 seconds. The strike operation allows the plasma to be ignited at low pressure in this embodiment, typically in the range of 10 to 100 mT, and then the plasma is maintained for 15 seconds at 0.4 Torr in the Plasma step to provide a high pressure, high density plasma for isotropic surface conditioning of the substrate 70.

After pre-cleaning, the flow and pressure is stabilized for 10 seconds. A first deposition step is performed for 6 seconds. The chamber is purged with carrier gas or an inert gas such as N₂ for 3 seconds, and the chamber is evacuated for 3 seconds to remove residual liquid precursors and/or vapor from the chamber. A plasma strike operation is performed for 3 seconds to ignite and stabilize a plasma after which the layer that was deposited in step 5 is treated for 30 seconds at a pressure of 0.4 Torr. For each additional layer of deposition, the process loops back to step 4 and repeats. When the desired film thickness is achieved, the plasma is extinguished and the substrate is optionally allowed to cool for 30 seconds before it is removed from the chamber. The timing of the steps are illustrative and can be varied from as low as a half a second to as high as five minutes for various processes, depending on the desired properties of the film.

FIG. 4 shows a flow chart of a nanolayer thick film process in accordance with one embodiment of the invention. The NLD technique is a combination of ALD and CVD and thus makes use of the advantages of both ALD and CVD. The process of FIG. 4 includes positioning a substrate in a chamber 200, exposing the device or substrate to a gaseous first reactant, wherein the first reactant deposits on the substrate or device to form a thin film 204; purging, evacuating, displacing, or otherwise removing the gaseous precursors from the chamber 206; and exposing the device, coated with the first reactant, to a gaseous second reactant under plasma, wherein the thin film deposited by the first reactant is treated to modify 208 the film properties or surface properties of the deposited film by one or more of extracting unwanted impurities, incorporating additional or new elements, exchanging elements in the deposited film, and changing the stoichiometry of elements in the layer. Other changes to the film properties, such as electrical or thermal resistivity or crystallinity, among others, might occur concurrently with these changes and remain within the scope of the present invention. The cyclic process, 204, 206, 208, 210 can be repeated if the decision to continue 212 is made. Alternatively, the process can be terminated 214.

In an embodiment of the process shown in FIG. 3, a first gas reactant is flowed over a wafer surface and deposits on the wafer. The amount of the first gas reactant into the chamber is controlled by a liquid flow controller (LFC) and valves, for example, to control the deposition of a layer. The first reactant in this embodiment is then purged with inert gas, and evacuated from the chamber volume. A second reactant is then flowed into the chamber to react with the first reactant to treat the deposited layer. A plasma is used during the second reactant injection to enhance or maintain the conformality of the deposited film on complex topography. The density of the deposited film may also increase after plasma treatment during the second reactant injection. The plasma treatment can also modify the film properties or surface properties of the deposited film by one or more of extracting unwanted impurities, incorporating additional or new elements, exchanging elements in the deposited film, and changing the stoichiometry of elements in the layer. Other changes to the film properties, such as electrical or thermal resistivity or crystallinity, among others, might occur concurrently with these changes and remain within the scope of the present invention. The second reactant is optionally purged and removed by pumping. Other reactants can be introduced into the process chamber to react with the deposited and reacted film to form a final film. The above steps are repeated to form a thick film that comprises the accumulated sum of the thicknesses deposited in each cycle of the overall NLD process.

Figure 7:
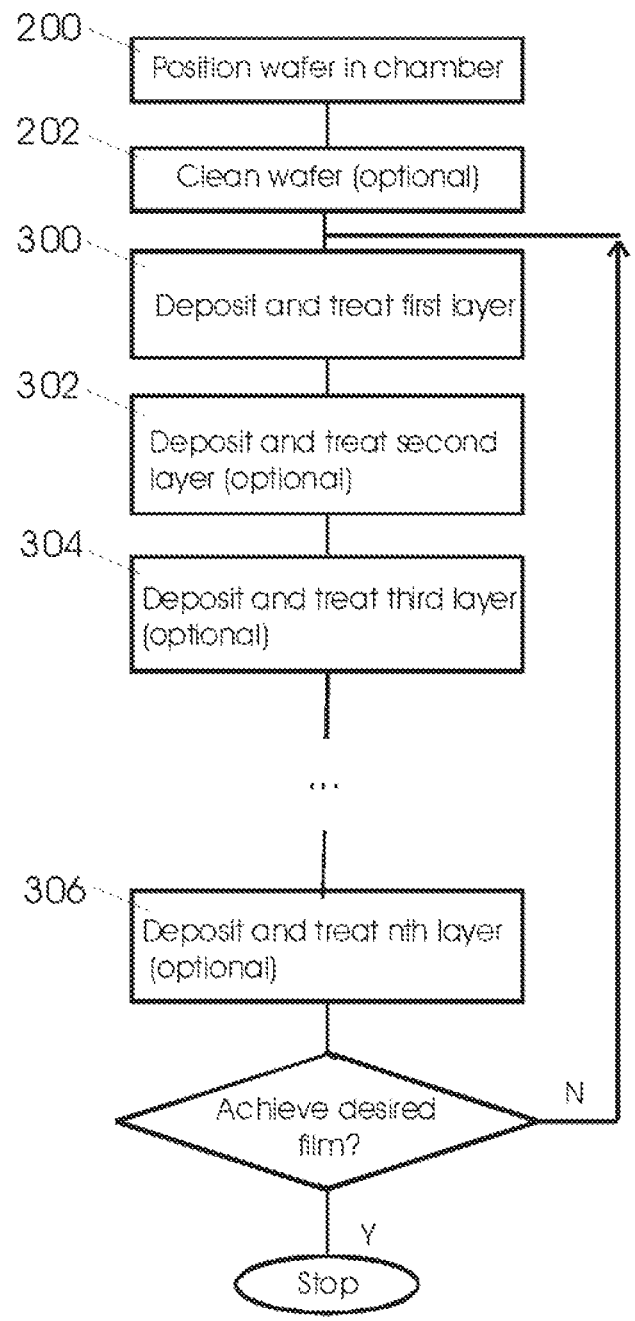
FIG. 7 shows a flowchart of one exemplary semiconductor manufacturing process using the system of FIG. 1 in which multiple layer types of films or process treatments are used to form a composite film stack using the inventive process.

In yet another embodiment of the inventive process, the steps of which are shown in FIG. 7, multiple combinations of deposition and treatment steps are used to fabricate the desired film. After a substrate is positioned 200 in the process chamber 100, and the substrate is exposed to an optional cleaning step 210, the substrate is then exposed to the initial process cycle 300 containing a deposition step and a plasma treatment step. Rather than immediately repeating the same process cycle 300, however, the substrate is exposed to one or more additional process cycles 302, 304, 306 until the desired combination of process steps are used to create the desired film structure.

In an embodiment, an additional process cycle 302 utilizes different first precursors than those used in process cycle 300 to create a process that consists of a sequence of cyclic process steps 300, 302 to produce a desired film. For example, in this embodiment, process cycle 300 could use TDMAT to deposit a TiN layer followed by a nitrogen plasma treatment and then followed by process cycle 302 using TEMAT to deposit a second thin TiN layer followed by the same or a different nitrogen plasma treatment. After deposition and treatment of the second TiN layer 302, the process repeats with deposition of a thin TiN layer with treatment using TDMAT 300 followed again by the TEMAT process 302.

In alternative embodiments, PDMAT could be used to deposit thin TaN layer rather than a second TiN layer to produce a laminate structure of TiN and TaN. The same or different parameters can be utilized for the plasma treatments in this embodiment.

In another embodiment, an additional process cycle 302 utilizes a different set of plasma treatment parameters than that used in process cycle 300 to create a process consisting of a sequence of cyclic process steps 300, 302 to produce a desired film. For example, in this embodiment, the bias power and pressure for process cycle 300 could be 150 W at 50 mT and for process cycle 302 could be 100 W at 100 mT. In this embodiment, the deposition steps for the TiN are identical and only the treatments steps differ.

In yet another embodiment, the additional process cycle 302 utilizes a different set of second precursors and a different set of plasma treatment conditions than those used in initial process cycle 300. For example, in this embodiment, TDMAT is used to deposit a thin layer of TiN, followed by an exposure to a nitrogen plasma treatment at 100 mT for the initial portion of the process cycle 300. TDMAT is then used to deposit a thin layer of TiN which is then exposed to an oxygen plasma at 200 mT in the latter part of the process cycle 302 to produce a laminate structure of TiN and TiON.

In yet another embodiment, the additional process cycle 302 utilizes a different set of first precursors, a different set of second precursors, and a different set of plasma treatment conditions than those used in initial process cycle 300. For example, in this embodiment, TDMAT is used to deposit a thin layer of TiN, followed by an exposure to a nitrogen plasma treatment at 100 mT for the initial portion of the process cycle 300. PDMAT is then used to deposit a thin layer of TaN which is then exposed to an oxygen plasma at 200 mT in the latter part of the process cycle 302 to produce a laminate structure of TiN and TaON.

In yet another embodiment, two additional process cycles 302, 304 utilize different combinations of first precursors and plasma treatment conditions than those used in initial process cycle 300. For example, in this embodiment, TDMAT is used to deposit a thin layer of TiN, followed by an exposure to a nitrogen plasma treatment at 100 mT for the initial portion of the process cycle 300. PDMAT is then used to deposit a thin layer of TaN which is then exposed to an oxygen plasma at 200 mT in a middle part of the process cycle 302 to produce a laminate structure of TiN and TaON. PDMAT is then used to deposit a thin layer of TaN, followed by an exposure to an nitrogen plasma treatment at 125 mT for the latter part of the process cycle 304 to produce a laminate structure of TiN, TaON, and TaN. The process steps 300, 302, and 304 are repeated until the desired laminate film thickness is achieved.

These exemplary embodiments are provided for illustrative purposes only. Other combinations and variations can be utilized within the scope of the present invention. For example, other precursor materials can be used, other plasma treatment gases and process parameters can be used, and other sequences and combinations of sequences can be used within the scope of the present invention. The order of process cycles need not be the same throughout the thickness of the film and the number of different types of cycles that can be used is not limited. For example, a laminate structure composed of 100 cycles can conceivably have 100 hundred different sets of process conditions, precursors, or treatment parameters and be within the scope of the present invention. Additionally, the process conditions and treatment parameters could be configured to vary during a deposition or treatment step or over the range of cycles used to produce the desired film thickness.

In NLD processes, the deposition of precursor materials occurs by decomposition and is not self-limiting. That is, the thickness of the film will increase with increasing exposure time to the precursor materials. For example, the growth rate does not change significantly over the duration of the deposition steps with increasing exposure to the precursors. The range of thicknesses for deposited layers in NLD processes can vary from fractions of a monolayer to 10 s to 100 s of monolayers, or more, without significant changes in the observed growth rate. In practice, however, the deposited film thickness per cycle in an NLD process is limited by the ability of the plasma treatment process to propagate through the deposited film thickness and is generally limited to a fraction of a monolayer to several monolayers. In contrast, in ALD processes, the deposition of precursor materials occurs by adsorption and is self-limiting in that the concentration of precursors on the surface will saturate and the growth rate of the adsorbed layer will exponentially decay with increasing exposure to the precursors. The thickness of the adsorbed layer is limited to approximately one monolayer of adsorbed precursor material.

A significant benefit of the inventive process using bias power applied to the substrate is to provide a means to accelerate the plasma treatment and to improve the efficacy of the plasma treatment portion of the cyclic NLD process. In FIG. 2, a plot of the measured resistivity of TiN thin films deposited using NLD processing is shown for treatment conditions in which power is provided to a chamber either through an ICP source or through the substrate. Comparison of the two plots in FIG. 2 show that the TiN films that were treated with power applied through the substrate resulted in more rapid reductions in electrical resistivity, a film characteristic that is highly dependent on the concentration of carbon in the film. As the bias power is increased from 40 W to 300 W, the measured resistivity was reduced from approximately 3000 microohm-cm to approximately 225 microohm-cm. In the preparation of these TiN films, 15 second nitrogen plasma treatment times were used. In contrast, when plasma source power was applied only through a downstream ICP source, significantly higher power levels were required.

The temperature in some embodiments utilizing NLD processes is higher than the temperatures used in ALD processes, but lower than that of the conventional CVD processes. The deposition rate in NLD processes can be controlled by tailoring the wafer temperature or chuck (or susceptor) temperature, process pressure, and gas flow rate, among other parameters.

The NLD process has been shown to provide levels of conformality approaching 100% in high aspect ratio features of >8:1 in which the feature opening is approximately 0.1 um. Excellent film conformality is achieved with NLD, similar to that of ALD, and far superior than that of thick CVD films.

In applications in which films of a few to 10 nanometers in thickness are required, the NLD process provides higher throughput than ALD, since in each NLD cycle, a film thickness of a few nanometers can be deposited. Additionally, since NLD processing has higher throughput in comparison to ALD, the dependency on chamber volume is reduced and therefore, conventional CVD process chambers can be used.

It should be realized that the above examples represent a few of a virtually unlimited number of applications of the plasma processing techniques embodied within the scope of the present invention. Furthermore, although the invention has been described with reference to the above specific embodiments, this description is not to be construed in a limiting sense. For example, the duty ratio, cycle time and other parameters and conditions may be changed to obtain desired wafer characteristics.

Various modifications of the disclosed embodiment, as well as alternative embodiments of the invention, will become apparent to persons skilled in the art upon reference to the above description. The invention, however, is not limited to the embodiment depicted and described. For instance, the radiation source can be a radio frequency heater rather than a lamp. Hence, the scope of the invention is defined by the claims that follow. It is further contemplated that the claims will cover such modifications that fall within the true scope of the invention.

What is claimed is:

1. A deposition method to deposit a thin film comprising:
introducing into a chamber a first plurality of precursors to deposit, using thermally activated chemical vapor deposition (CVD), a first layer on a substrate in a non-self-limiting deposition process;
after depositing the first layer, introducing a second plurality of precursors in a plasma ambient that modify the deposited first layer in a plasma modification process conducted for between 0.5 second and 30 seconds, wherein the plasma ambient is generated using a first power source;
wherein the plasma modification process comprises, during generation of the plasma ambient using the first power source, applying a pulsed bias from a second power source to a substrate, wherein applying comprises performing multiple bias pulses on the deposited first layer, wherein applying the multiple bias pulses is performed throughout the duration of the plasma modification process,
wherein a pulse period for the pulsed bias is less than 1 millisecond,
wherein a duty cycle for applying the pulsed bias comprises a time ratio for a time in a high power state over a sum of the time in the high power state and a time in the low power state, wherein the duty cycle is greater than 50%, and
repeating the deposition and plasma modification process for at least one subsequent layer.

2. The method of claim 1 wherein each plasma modification process incorporates impurities to the deposited first or subsequent layer.

3. The method of claim 1 wherein each plasma modification process removes impurities from the deposited first or subsequent layer.

4. The method of claim 1 wherein each plasma modification process replaces elements from the deposited first or subsequent layer with same elements from the plasma ambient.

5. The method of claim 1 wherein each plasma modification process comprises one or more of extracting impurities, incorporating additional elements, exchanging elements in the deposited first or subsequent layer, changing a stoichiometry of elements in the deposited first or subsequent layer, and changing electrical or thermal resistivity or crystallinity.

6. The method of claim 1 wherein each plasma modification process comprises powering the substrate with power levels that are less than a sputtering threshold power.

7. The method of claim 1 wherein each plasma modification process comprises powering the substrate with power levels that are approximately equal to a sputtering threshold power.

8. The method of claim 1 wherein each plasma modification process comprises powering the substrate a pulsed power source in which the high power state uses bias power levels that are higher than a sputtering threshold power and the low power state uses bias power levels that are below the sputtering threshold power.

9. The method of claim 1 wherein each plasma modification process comprises powering the substrate with a power level of less than about 300 W at 13.56 MHz.

10. The method of claim 1 wherein each plasma modification process comprises powering the substrate with a bias frequency in the range of 0.1 to 100 MHz.

11. The method of claim 1 further comprising:
repeating the deposition and plasma modification process for the at least one subsequent layer, wherein the at least one subsequent layer incorporates at least one of a different first precursors, different second precursors, and different plasma modification conditions.

12. The method of claim 11 further comprising:
repeating the deposition and plasma modification process for the first layer and the at least one subsequent layer.

13. The method of claim 1 wherein in each plasma modification process at least one of pressure, flow rate, plasma power, plasma frequency, bias duty cycle, and precursor selection is varied over the duration of each plasma modification process.

14. The method of claim 1, wherein the plasma modification process is greater than 5 seconds.

15. The method of claim 1, wherein the duty cycle is greater than about 75%.

16. The method of claim 1, wherein the plasma modification process is conducted for between 0.5 second to 10 seconds.

17. The method of claim 1, wherein the plasma modification process is conducted for between 5 seconds and 10 seconds.

18. The method of claim 1, wherein the deposited first layer is a few nanometers thick.

19. A deposition method to deposit a thin film comprising:
depositing, using thermally activated chemical vapor deposition (CVD), a first layer on a substrate in a non-self-limiting deposition process; and
plasma treating the deposited layer with a plasma ambient generated using a first power source and a pulsed bias applied to the substrate, the pulsed bias generated using a second power source during generation of the plasma ambient using the first power source, wherein plasma treating comprises multiple pulses on the deposited layer, wherein plasma treating is conducted for between 0.5 second and 30 seconds, wherein a pulse period for the pulsed bias is less than 1 millisecond, further wherein a duty cycle for the pulsed bias comprises a time ratio of a high power state to a sum of the high power state and a low power state of more than fifty percent; and
repeating the deposition and plasma treating for at least one subsequent layer.

20. The method of claim 19 wherein each plasma treating performs at least one of incorporating impurities to the deposited first or subsequent layer, removing impurities from the deposited layer, replacing elements from the deposited layer with same elements from the plasma ambient, and changing one or more properties or characteristics of the film.

21. The method of claim 19 wherein the pulsed bias powers the substrate with power levels that are less than a sputtering threshold power.

22. The method of claim 19 wherein the pulsed bias powers the substrate with power levels that are approximately equal to a sputtering threshold power.

23. The method of claim 19 wherein the pulsed bias powers the substrate with a power level of less than about 300 W at 13.56 MHz.

24. The method of claim 19 wherein the pulsed bias powers the substrate with a bias frequency in the range of 0.1 to 100 MHz.

25. The method of claim 19 further comprising:
repeating the deposition and plasma treating for the at least one subsequent layer, wherein the subsequent layer incorporates at least one of different first precursors, different second precursors, and different plasma modification conditions.

26. The method of claim 25 further comprising:
repeating the deposition and plasma treating for the first layer and the at least one subsequent layer.

27. The method of claim 19 wherein during plasma treating the deposited first or subsequent layer at least one of pressure, flow rate, plasma power, plasma frequency, bias duty cycle, and precursor selection is varied over the duration of the plasma treatment.

28. The method of claim 19, wherein the duty cycle is greater than about 75%.

29. The method of claim 19, wherein the plasma modification process is conducted for between 0.5 second to 10 seconds.

30. A deposition method to deposit a thin film comprising:
introducing into a chamber a first plurality of precursors to deposit a first layer on a substrate using thermally activated chemical vapor deposition (CVD);
after depositing the first layer, introducing a second plurality of precursors in a plasma ambient that modify the deposited first layer in a plasma modification process conducted for between 0.5 second and 30 seconds, wherein the plasma ambient is generated using a first power source; and
repeating the deposition and plasma modification process for at least one subsequent layer,
wherein each plasma modification process comprises pulsing, during generation of the plasma ambient using the first power source, at least one of a bias power and bias voltage on the substrate between at least one power level above a sputtering threshold power and at least one power level below the sputtering threshold power,
wherein pulsing comprises applying multiple bias pulses on the deposited first or subsequent layer,
wherein a pulse period for the multiple bias pulses is less than 1 millisecond,
wherein a duty cycle for the multiple bias pulses includes a high power state that comprises the at least one power level above a sputtering threshold power more than half the time, wherein the at least one of a bias power and bias voltage is generated by a second power source.

31. The method of claim 30 wherein the plasma modification process performs at least one of incorporating impurities to the deposited first or subsequent layer, removing impurities from the deposited first or subsequent layer, replacing elements from the deposited first or subsequent layer with same elements from the plasma-ambient, and changing one or more properties or characteristics of the film.

32. The method of claim 30 wherein the at least one of a bias power and a bias voltage deliver power to the substrate with a power level of less than about 300 W at 13.56 MHz.

33. The method of claim 30 wherein the at least one of a bias power and a bias voltage deliver power to the substrate with a frequency in the range of 0.1 to 100 MHz.

34. The method of claim 30 wherein
repeating the deposition and plasma modification process for the at least one subsequent layer incorporates at least one of a different first precursors, different second precursors, and different plasma modification conditions.

35. The method of claim 30 wherein in the plasma modification process at least one of pressure, flow rate, plasma power, plasma frequency, bias duty cycle, and precursor selection is varied over the duration of the plasma modification.

* * * * *